(12) United States Patent
Uhlemann et al.

(10) Patent No.: US 8,872,332 B2
(45) Date of Patent: Oct. 28, 2014

(54) POWER MODULE WITH DIRECTLY ATTACHED THERMALLY CONDUCTIVE STRUCTURES

(75) Inventors: Andre Uhlemann, Dortmund (DE); Alexander Herbrandt, Warstein (DE); Frank Broermann, Büren (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/459,844

(22) Filed: Apr. 30, 2012

(65) Prior Publication Data

US 2013/0285234 A1    Oct. 31, 2013

(51) Int. Cl.
*H01L 23/367*    (2006.01)

(52) U.S. Cl.
CPC ....... *H01L 23/367* (2013.01); *H01L 2224/4813* (2013.01); *H01L 2224/48137* (2013.01); *H01L 2224/48091* (2013.01); *H01L 2224/49175* (2013.01)
USPC .......................................... 257/712; 257/782

(58) Field of Classification Search
USPC .................. 257/E23.101, E23.105, E25.023, 257/E23.068, E23.08, E21.503, E21.092, 257/712
See application file for complete search history.

(56) References Cited

U.S. PATENT DOCUMENTS

| | | | | |
|---|---|---|---|---|
| 5,786,230 A * | 7/1998 | Anderson et al. | ............. | 438/108 |
| 6,069,023 A * | 5/2000 | Bernier et al. | ................ | 438/107 |
| 6,807,059 B1 * | 10/2004 | Dale | ............................. | 361/703 |
| 7,736,920 B1 * | 6/2010 | Wu et al. | ......................... | 438/22 |
| 8,115,303 B2 * | 2/2012 | Bezama et al. | ............... | 257/719 |
| 8,118,303 B2 * | 2/2012 | Obuchi et al. | ................. | 271/249 |
| 2006/0068522 A1 * | 3/2006 | Yoshimura | .................... | 438/108 |
| 2007/0121299 A1 * | 5/2007 | Campbell et al. | ............. | 361/710 |
| 2009/0200065 A1 * | 8/2009 | Otoshi et al. | .................. | 174/252 |

FOREIGN PATENT DOCUMENTS

DE    102010003533 A1    10/2011

OTHER PUBLICATIONS

Josef Lutz, Heinrich Schlangenotto, Uwe Scheuermann, Rik De Doncker. Semiconductor Power Devices: Physics, Characteristics, Reliability. Book. Springer-Verlag Berlin Heidelberg, 2011. New York, USA.

* cited by examiner

*Primary Examiner* — Zandra Smith
*Assistant Examiner* — Paul Patton
(74) *Attorney, Agent, or Firm* — Murphy, Bilak & Homiller, PLLC

(57) ABSTRACT

A power module includes a substrate having an electrically insulative member with opposing first and second metallized sides and one or more semiconductor die attached to the first metallized side of the substrate. A plurality of thermally conductive structures are laterally spaced apart from one another and individually attached directly to the second metallized side of the substrate so that the plurality of thermally conductive structures extend outward from the second metallized side.

12 Claims, 7 Drawing Sheets

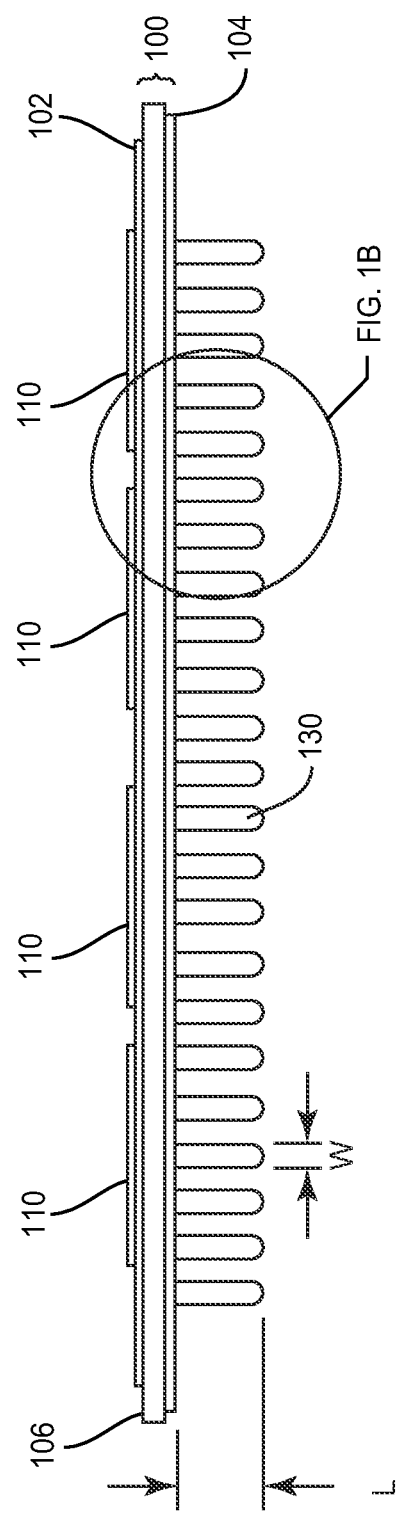

POWER MODULE WITH DIRECTLY ATTACHED THERMALLY CONDUCTIVE STRUCTURES

BACKGROUND

Semiconductor devices are typically protected against overheating by providing an efficient cooling system for the power module. Power modules can be cooled directly or indirectly, and may have a base plate which can be flat or structured. Conventional base plates are typically made of copper for high heat conductivity. Other lower-cost materials such as AlSiC, aluminum or clad materials can be substituted for copper in the base plate. The base plate can be excluded from the power module to even further reduce cost, but the thermal performance is worse in comparison with modules that use a base plate.

Power modules with and without a base plate are conventionally cooled indirectly by an air or fluid based cooler. The heat generated by the semiconductor devices flows through a ceramic substrate of a DCB-stack (DCB=directed copper bonded), and also through the different solder layers including chip-soldering and system soldering and finally through the base plate. The thermal contact for heat conduction between the base plate and cooler (or between the substrate and cooler if a base plate is not present) is typically realized by thermal grease provided between the base plate or substrate and the cooler. Cooling is less than optimum with such an arrangement because thermal grease has a low heat conductivity of about 1 W/mK.

Directly cooled power modules with a structured base plate more efficiently cool the power devices. The base plate typically has cooling structures such as pins, fins or fin-like structures on the cooling side of the base plate and which are in direct contact with the cooling liquid such as water, or a water glycol mixture so that high heat transfer coefficients are achieved. Different technologies for fabricating the base plate include metal injection molding process (MIM) or forging technology. In both cases, the cooling structures are not directly attached to the cooling side of the base plate. Instead, one or more intermediary materials such as solder, etc. are used to attach the cooling structures to the base plate which degrades thermal performance and increases module cost. Alternatively, the metallized surface of a ceramic substrate can be structured by etching. However, the length of the resulting structures is limited by the thickness of the metallization layer (e.g. about 600 μm for copper). Such structures are an integral part of the substrate metallization and therefore not attached to the substrate metallization, but rather have a continuous construction with the metallization. These cooling structures provide limited thermal capability. A structured DCB can be fabricated with micro deformation technology (MDT) which yields a structure length of about 1 to 2 mm. The resulting structures also have a continuous construction with the substrate metallization and a relatively small cross-sectional width, likewise limiting the thermal capability of the module.

SUMMARY

According to an embodiment of a power module, the power module includes a substrate comprising an electrically insulative member with opposing first and second metallized sides and one or more semiconductor die attached to the first metallized side of the substrate. A plurality of thermally conductive structures are laterally spaced apart from one another and individually attached directly to the second metallized side of the substrate so that the plurality of thermally conductive structures extend outward from the second metallized side.

According to another embodiment of a power module, the power module includes a substrate comprising an electrically insulative member with opposing first and second metallized sides and one or more semiconductor die attached to the first metallized side of the substrate. A cooler has a solid portion attached to the second metallized side of the substrate and a cavity. A plurality of thermally conductive structures are laterally spaced apart from one another and individually attached directly to the second metallized side of the substrate so that the plurality of thermally conductive structures extend outward from the second metallized side into the cavity and are laterally surrounded by the cooler.

According to an embodiment of a method of manufacturing a power module, the method comprises: attaching one or more semiconductor die to a first metallized side of a substrate, the substrate comprising an electrically insulative member with the first metallized side and an opposing second metallized side; and attaching a plurality of individual thermally conductive structures directly to the second metallized side of the substrate so that the plurality of thermally conductive structures are laterally spaced apart from one another and extend outward from the second metallized side.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1A illustrates a cross-sectional view of a power module with directly attached thermally conductive structures.

DETAILED DESCRIPTION

Figure 1B:
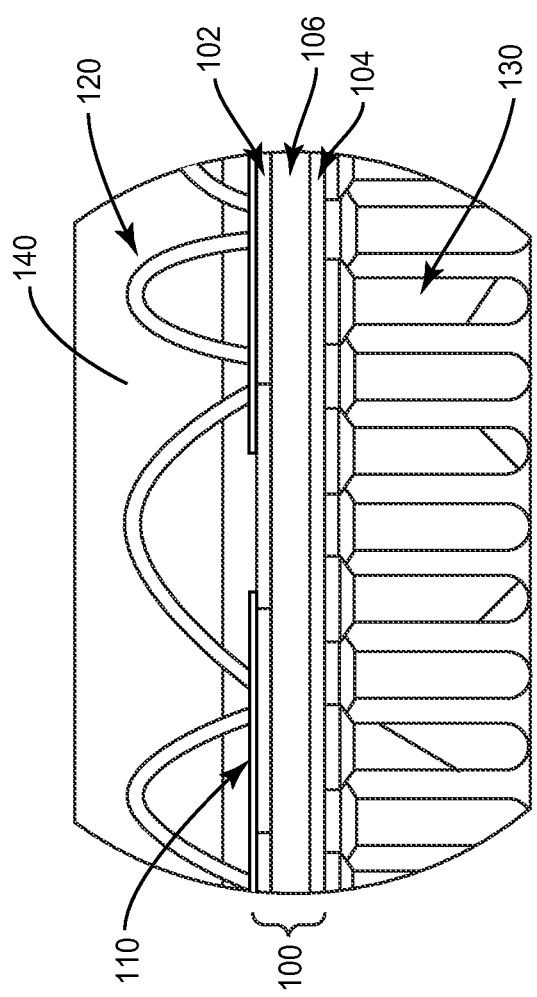
FIG. 1B illustrates an exploded cross-sectional view of a portion of the power module shown in FIG. 1A.

FIG. 1A illustrates an embodiment of a power module and FIG. 1B illustrates an enlarged view of the section of the power module indicated by a circle in FIG. 1A, with the addition of bond wire connections 120. The power module includes a substrate 100 having a metallized die side 102 and a metallized cooling side 104, and an electrically insulative member 106 interposed between the die side and cooling side metallizations 102, 104. One or more semiconductor die 110 such as diodes, IGBTs (insulated gate bipolar transistors) or FETs (field effect transistors) are attached to the metallized die side 102 of the substrate 100 using any suitable conventional die attach process such as sintering or soldering. As shown in the partial enlarged view of FIG. 1B, various bond wire connections 120 can be provided between the metallized die side 102 and each semiconductor die 110 attached to the die side 102 of the substrate 100. The metallized cooling side 104 dissipates heat generated by the die 110 during operation.

To this end, thermally conductive cooling structures 130 are provided at the cooling side 104 of the substrate 100 to improve the heat transfer characteristics of the power module. The cooling structures 130 are laterally spaced apart from one another and individually attached directly to the metallized cooling side 104 of the substrate 100 by adhesion bond connections so that the cooling structures 130 extend outward from the cooling side 104 away from the substrate 100. Directly attaching the cooling structures 130 to the cooling side 104 of the substrate 100 provides a high heat transfer coefficient and low thermal resistance that is comparable with directly-cooled base plate systems. A power module based on such directly attached individual thermally conductive cooling structures 130 dispenses with the base plate and corresponding soldering so that the process and material costs can be reduced. In addition, a significant weight reduction is achieved by eliminating the base plate.

In one embodiment, the cooling structures 130 are individually welded to the metallized cooling side 104 of the substrate 100 using an (electrical) arc welding technology. Arc welding technology enables structures with adhesion bond connections on the surface of a ceramic substrate, the adhesion bonds having a positive impact on the reliability of the module system.

The cooling structures 130 are arc welded to the metallized cooling side 104 of the substrate 100 by applying a potential to the metallized cooling side 104 and positioning metal structures such as pins, fins, etc. in close proximity to the cooling side 104 of the substrate 100. This in turn causes an arc to ignite between each metal structure and the metallized cooling side 104. A current flows from each metal structure to the metallized cooling side 104 of the substrate 100 as a result of the arcing, causing a part of each metal structure and a part of the metallized cooling side 104 to melt. Each metal structure is then placed in direct contact with the metallized cooling side 104 of the substrate 100 after the melting begins so that an adhesion bond connection is formed between each metal structure and the metallized cooling side 104. The arcing and adhesion process typically takes place in a specific atmosphere for arc welding processes to improve the quality of the adhesion bond connection between the materials. Each metal structure is then severed at a distance from the metallized cooling side 104 after adhesion bonding to form the individual cooling structures 130 directly attached to the metallized cooling side 104 of the substrate 100. The metal structures 130 can be mechanically cut (severed) or electrically severed based on a specific modulation of the electrode current, the frequency of which causes the metal structures to be cut off at a particular distance from the substrate 100.

Figure 2:
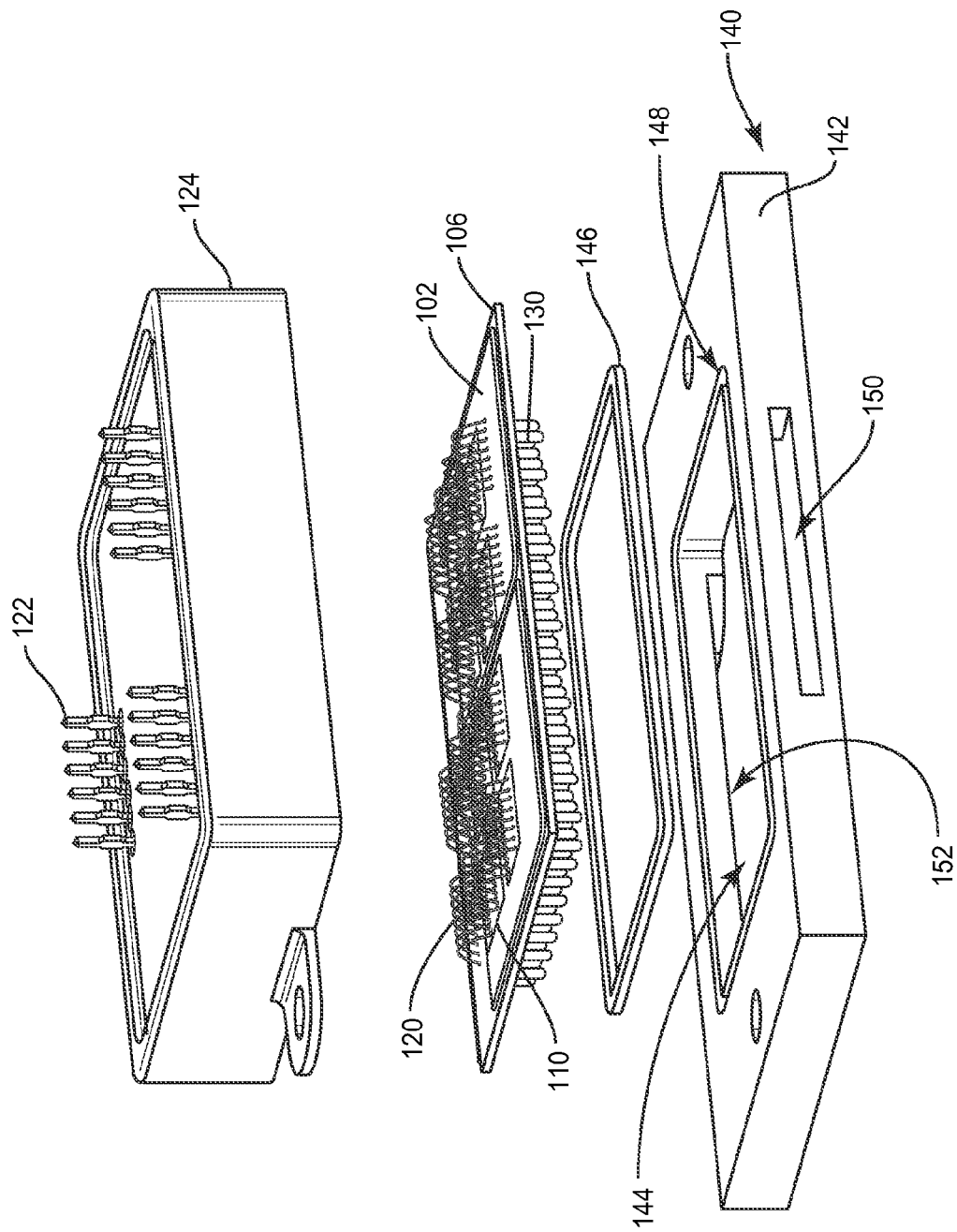
FIG. 2 illustrates an exploded perspective view of a power module with directly attached thermally conductive structures positioned within a cavity of a cooler.

FIG. 2 illustrates an exploded view of a package including the substrate 100 with various semiconductor die 110 attached to the metallized die side 102 of the substrate 100 and the individual cooling structures 130 directly attached to the metallized cooling side 104 of the substrate 100 by adhesion bond connections. Electrical connections are provided to the semiconductor die 110 attached to the metallized die side 102 of the substrate 100 e.g. by bond wires 120 and terminals 122 which can provide control signals and load current. After die soldering and bonding steps, a plastic housing 124 can be glued together with the substrate 100. The plastic housing 124 covers the semiconductor die 110. An encapsulant such as a gel can be injected into open space within the housing 124 for added electrical isolation. The arc welding technology or other direct attach technology can be applied before or after the plastic housing 124 is attached to the substrate 100 to yield cooling structures 130 directly attached to the metallized cooling side 104 of the substrate 100 by adhesion bond connections for a direct fluid cooling.

The power module further includes a cooler 140 having a solid portion 142 attached to the metallized cooling side 104 of the substrate 100, and a cavity 144. The cooling structures 130 are laterally spaced apart from one another and individually attached directly to the metallized cooling side 104 of the substrate 100 so that the cooling structures 130 extend outward from the metallized cooling side 104 into the cavity 144 of the cooler 140 and are laterally surrounded by the cooler 140. A sealing ring 146 can be seated in a recess 148 formed in the cooler 140 to provide a seal between the cooler 140 and the metallized cooling side 104 of the substrate 100. A cooling liquid such as water or a water glycol mixture can pass through openings 150, 152 in the cavity 144, removing waste heat energy from the cooling structures 130. Alternatively, the cooling structures 130 can be air cooled and no cooler is provided. For an air-cooled system, the length of the cooling structures 130 can range from e.g. 1 mm to 80 mm and for a fluid-cooled system the length can range from e.g. 1 mm to 20 mm by using arc welding technology or other suitable direct attach technology such as friction welding, laser or other welding technology or ball bonding technology to directly attach the cooling structures 130 to the substrate 100 by adhesion bond connections as previously described herein.

Figure 3:
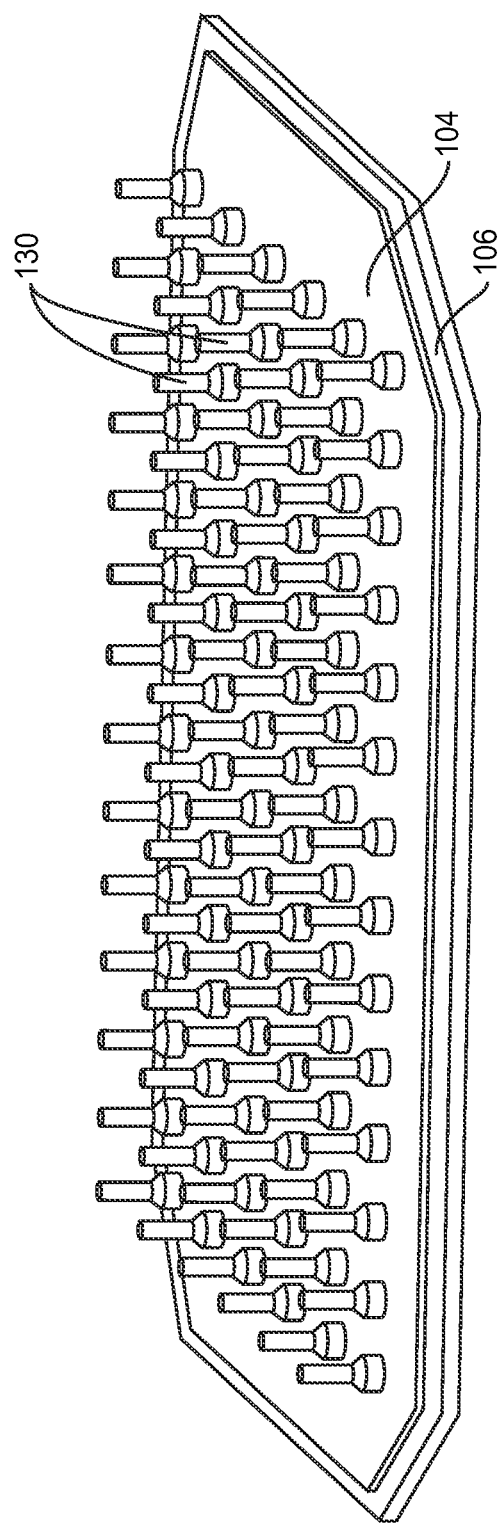
FIG. 3 illustrates a plan view of the bottom side metallization of the power module with the directly attached thermally conductive structures.

FIG. 3 illustrates a plan view of the metallized cooling side 104 of the substrate 100 after the cooling structures 130 are individually attached directly to the metallized cooling side 104. According to one embodiment, each cooling structure 130 has a length L as shown in FIG. 1A measured extending outward from the metallized cooling side 104 which ranges from 0.5 mm to 5 cm and a width W also shown in FIG. 1A which ranges from 0.1 mm to 3 mm. The length of the cooling structures 130 can be greater than the width i.e. the cooling structures 130 can be longer than wider. Alternatively or in addition, the width of the cooling structures 130 can be greater than the length i.e. the cooling structure 130 can be longer than wider. The cooling structures 130 can have the same length and width. Alternatively, the cooling structures 130 can have at least one of variable lengths and variable widths. That is, the length and/or width can vary across the cooling structures 130.

The cooling structures 130 can have any desired shape. In one embodiment, the cooling structures 130 have a cylindrical, columnar or hexagonal shape. The cooling structures 130 can be individually attached directly to the metallized cooling side 104 of the substrate 100 in rows and columns in an aligned manner so that the cooling structures 130 included in the same row or column align in the same plane as shown in FIG. 3. Alternatively, the cooling structures 130 can be arranged in a staggered manner so that at least some of the cooling structures 130 in the same row or column align in different planes.

The substrate 100 to which the individual cooling structures 130 are directly attached can be a direct copper bonded (DCB) substrate having die and cooling sides 102, 104 metallized with copper and an intermediary ceramic substrate 106. Alternatively, the substrate 100 can be a direct aluminum bonded (DAB) substrate having die and cooling sides 102, 104 metallized with aluminum and an intermediary ceramic substrate 106. Alternatively, an active metal brazed (AMB)

substrate can be used which has metal foils brazed to the die and cooling sides 102, 104 of the substrate 100. In yet another embodiment, the die side 102 is metallized with copper and the cooling side 104 is metallized with aluminum. In the case of the cooling side 104 metallized with copper, the metallized cooling side 104 and the cooling structures 130 can each comprise a copper alloy containing e.g. Ag or Sn. In the case of the cooling side 104 metallized with aluminum, the metallized cooling side 104 and the cooling structures 130 can each comprise an aluminum alloy. If the cooling structures 130 are made of copper, a plating process (e.g. nickel-gold-chrome) for the cooling side 104 of the substrate 100 can be used to protect the system against corrosion. If the substrate 100 has a mixed metallization e.g. the die side 102 is metallized with copper and the cooling side 104 is metallized with aluminum, nickel plating is not required.

Figure 4:
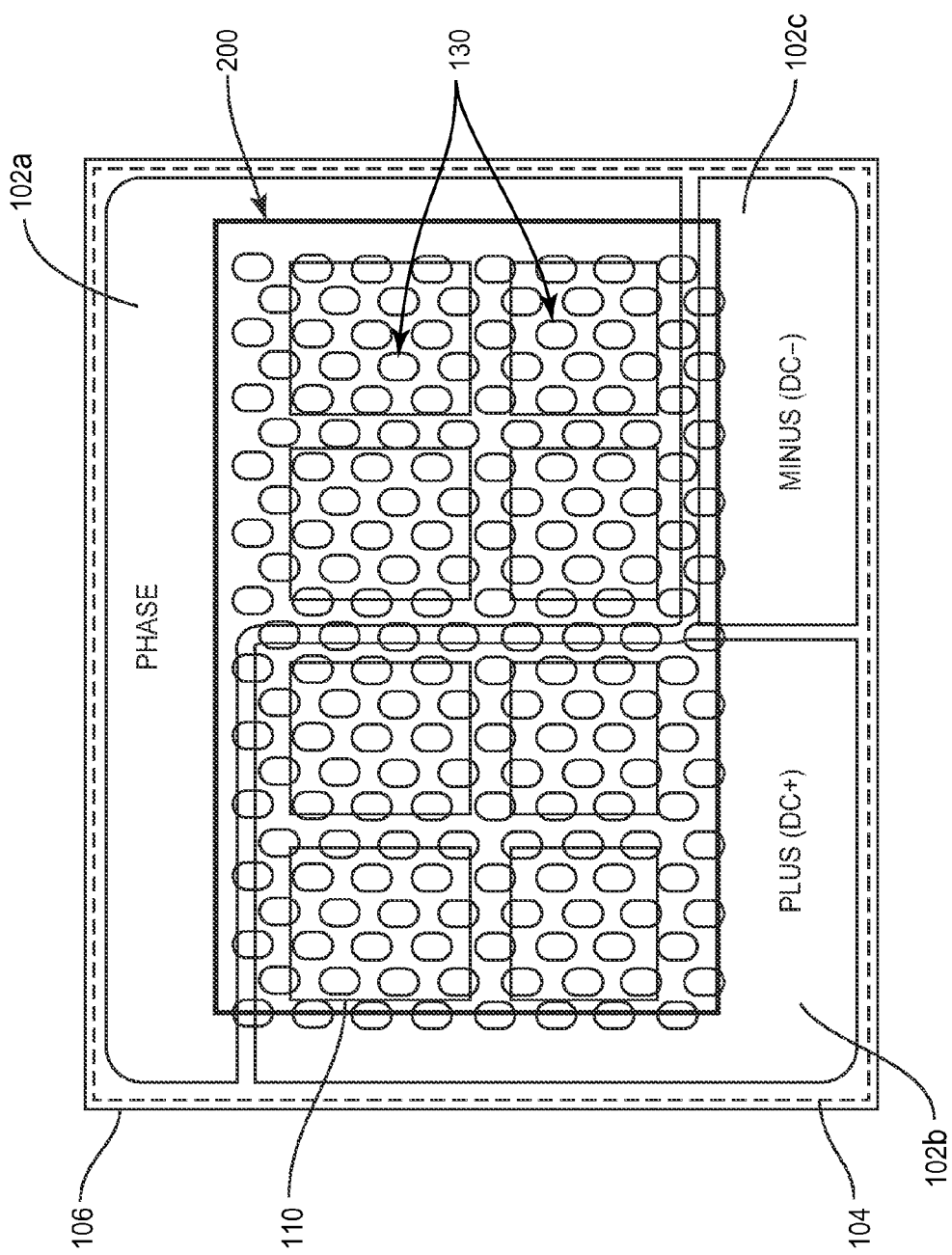
FIG. 4 illustrates a hybrid view of the top side die metallization of the power module superimposed with the directly attached thermally conductive structures.

FIG. 4 illustrates a partial schematic top-down plan view of the power module, without wire bond connections for ease of illustration. The cooling structure area 200 and placement of the individual cooling structures 130 directly attached to the metallized cooling side 104 (represented by a dashed box) of the substrate 100 are shown in relation to the semiconductor die 110 attached to the metallized die side 102 of the substrate 100. According to this embodiment, the semiconductor die 110 attached to the die side 102 of the substrate 100 are interconnected to form a half-bridge circuit. Other circuits can be formed such as full-bridge circuits, 3-phase circuits, etc. The metallized die side 102 is structured into three different regions 102a, 102b, 102c for providing the appropriate electrical connections to the half-bridge circuit: the phase input (Phase); the positive DC input (Plus (DC+)); and the negative DC input (Minus (DC−)).

The density of the cooling structures 130 can be higher in a region 200 of the metallized cooling side 104 of the substrate 100 corresponding to where the semiconductor die 110 are attached to the metallized die side 102 and lower elsewhere. For example, in FIG. 4 the cooling structures 130 are not disposed under the entire metallized die side 102 of the substrate 100. Instead, placement of the cooling structures 130 is limited to the region 200 of the metallized cooling side 104 of the substrate 100 above which the semiconductor die 110 are attached to the substrate 100. Such an arrangement of the cooling structures 130 reduces module cost while still providing adequate thermal transfer properties. In another embodiment, more cooling structures 130 may be placed underneath the semiconductor die 110 and fewer cooling structures 130 may be placed outside this die attach region. In each case, the cooling structures 130 are laterally spaced apart from one another and individually attached directly to the metallized cooling side 104 of the substrate 100 so that the cooling structures 130 extend outward from the cooling side 104.

Figure 5A:
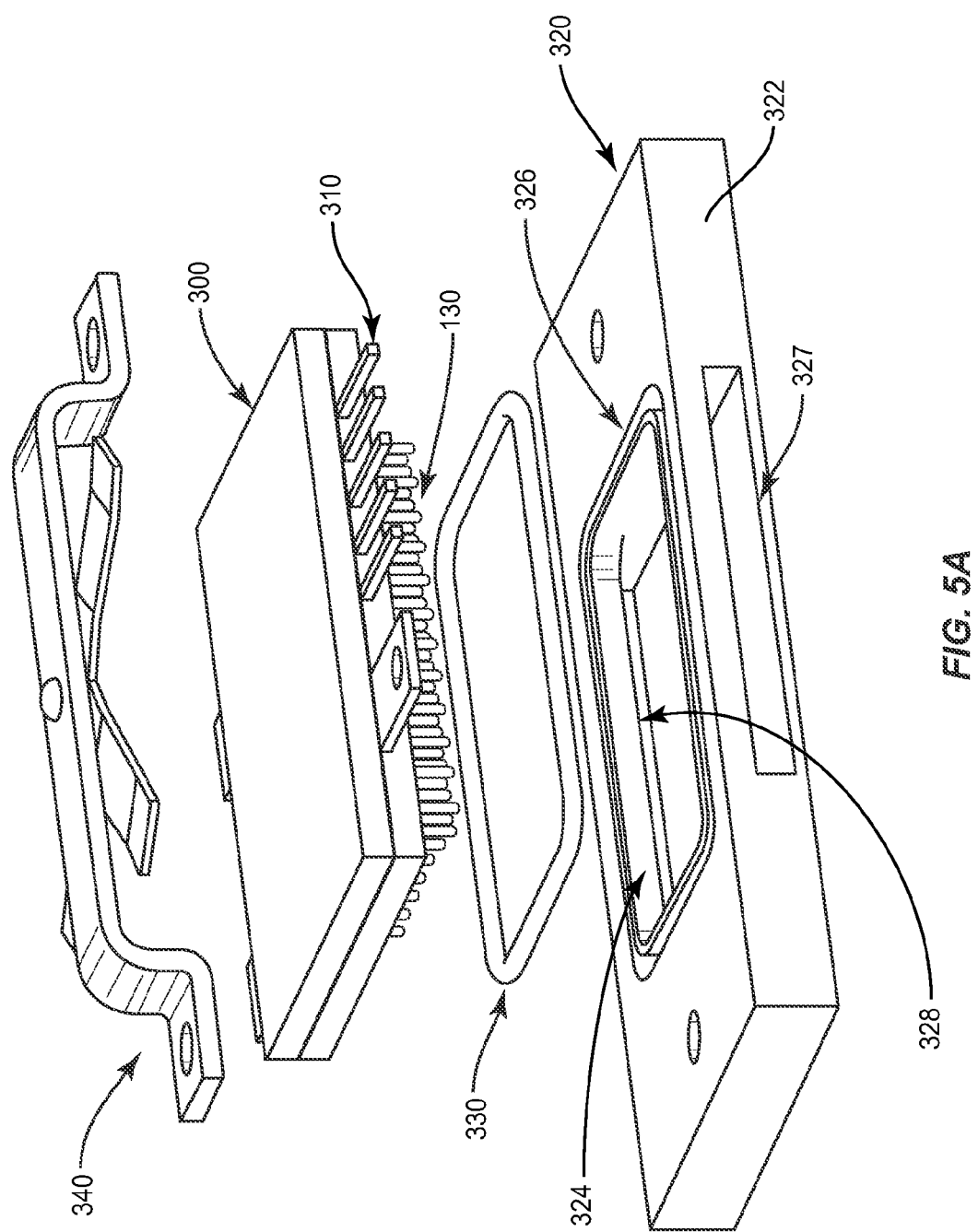
FIG. 5A illustrates an exploded perspective view of a power module with directly attached thermally conductive structures positioned within a cavity of a cooler according to another embodiment.
Figure 5B:
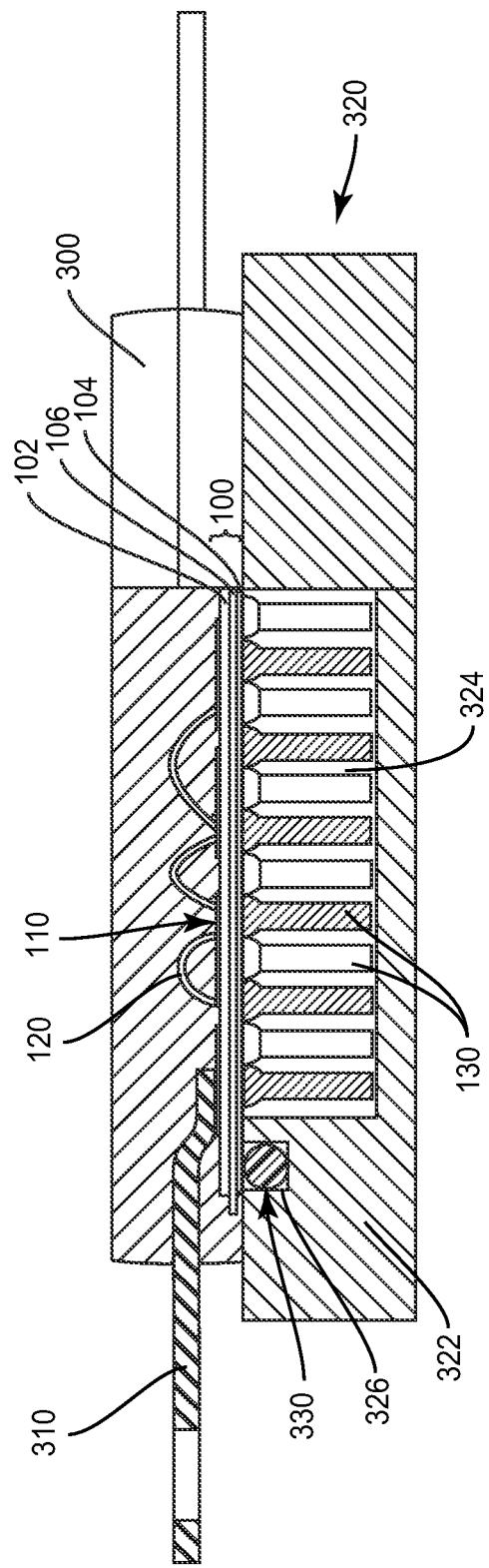
FIG. 5B illustrates a partial cross-sectional view of the power module shown in FIG. 5A.

FIG. 5A illustrates an exploded view of a power module, and FIG. 5B illustrates a corresponding partial cross-sectional view of the power module. The power module includes a substrate 100 having a metallized die side 102 and a metallized cooling side 104 spaced apart from one another by an electrically insulative member 106 as previously described herein. One or more semiconductor die 110 are attached to the metallized die side 102 of the substrate 100 also as previously described herein. The substrate 100 and die 110 are encased by a mold compound housing 300 e.g. similar to SMDs (surface mounted devices). The mold compound covers the semiconductor die 110 and parts of the substrate 100. Appropriate electrodes 310 extending outside the mold compound 300 are provided for electrical connections to the semiconductor die 110 attached to the die side 102 of the substrate 100. The mold compound 300 stabilizes the substrate 100 mechanically and ensures adequate electrical isolation.

A region of the cooling side 104 of the substrate 100 remains exposed after the substrate 100 and die 110 are encased by the mold compound 300 so that the cooling structures 130 can be directly attached to the exposed region of the metallized cooling side 104 of the substrate 100 by adhesion bond connections. In one embodiment, the cooling structures 130 are directly attached to the exposed region of the metallized cooling side 104 of the substrate 100 after the substrate 100 and die 110 are encased in the mold compound 300. Alternatively, the cooling structures 130 are directly attached to the exposed region of the metallized cooling side 104 of the substrate 100 before the substrate 100 and die 110 are encased in the mold compound 300. In either case, the individual cooling structures 130 can be directly attached to the metallized cooling side 104 of the substrate 100 by (electric) arc welding or other direct attach technology which provides adhesion bond connections as previously described herein.

The power module further includes a cooler 320 having a solid portion 322 attached to the metallized cooling side 104 of the substrate 100, and a cavity 324. The cooling structures 130 are laterally spaced apart from one another and individually attached directly to the metallized cooling side 104 of the substrate 100 so that the cooling structures 130 extend outward from the metallized cooling side 104 into the cavity 324 of the cooler 320 and are laterally surrounded by the cooler 320. A sealing ring 330 can be seated in a recess 326 formed in the cooler 320 to provide a seal between the cooler 320 and the metallized cooling side 104 of the substrate 100. A cooling liquid such as water or a water glycol mixture can pass through openings 327, 328 in the cavity 324, removing waste heat energy from the cooling structures 130. Alternatively, the cooling structures 130 can be air cooled and no cooler is provided. For an air-cooled system, the length of the cooling structures 130 can range from e.g. 1 mm to 80 mm and for a fluid-cooled system the length can range from e.g. 1 mm to 10 mm by using arc welding technology or other suitable direct attach technology which provides adhesion bond connections to directly attach the cooling structures 130 to the substrate 100 as previously described herein. A frame 340 can be provided for pressing the substrate on the sealing ring 330 to ensure closeness of the system.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power module, comprising:
a substrate comprising an electrically insulative member with opposing first and second metallized sides;
one or more semiconductor die attached to the first metallized side of the substrate;
a housing covering the one or more semiconductor die;
a plurality of thermally conductive structures laterally spaced apart from one another and individually welded directly to the second metallized side of the substrate so that the plurality of thermally conductive structures extend outward from the second metallized side;
a cooler having a solid portion attached to the second metallized side of the substrate and a cavity so that the plurality of thermally conductive structures extend into the cavity and are laterally surrounded by the cooler; and
a sealing ring seated in a recess formed in the cooler, the sealing ring providing a seal between the cooler and the second metallized side of the substrate.

2. A power module according to claim 1, wherein the housing is a plastic housing or a mold compound.

3. A power module according to claim 1, wherein each thermally conductive structure has a length measured from the second metallized side of the substrate extending outward which ranges from 0.5 mm to 5 cm and a width which ranges from 0.1 mm to 3 mm.

4. A power module according to claim 3, wherein the length of one or more of the plurality of thermally conductive structures is greater than the width.

5. A power module according to claim 3, wherein the width of one or more of the plurality of thermally conductive structures is greater than the length.

6. A power module according to claim 3, wherein the plurality of thermally conductive structures have at least one of variable lengths and variable widths.

7. A power module according to claim 1, wherein each thermally conductive structure has a cylindrical, columnar or hexagonal shape.

8. A power module according to claim 1, wherein a density of the plurality of thermally conductive structures is higher in a region of the second metallized side of the substrate corresponding to where each semiconductor die is attached to the first metallized side and lower elsewhere.

9. A power module according to claim 1, wherein the substrate is a direct copper bonded substrate, a direct aluminum bonded substrate, an active metal brazed substrate, or a substrate with the first metallized side comprising copper and the second metallized side comprising aluminum.

10. A power module according to claim 1, wherein the second metallized side and the plurality of thermally conductive structures each comprise a copper alloy.

11. A power module according to claim 1, wherein the second metallized side and the plurality of thermally conductive structures each comprise an aluminum alloy.

12. A power module according to claim 1, wherein the plurality of thermally conductive structures are individually attached directly to the second metallized side of the substrate in rows and columns in an aligned manner.

* * * * *